United States Patent
Timm

(10) Patent No.: US 6,329,936 B1
(45) Date of Patent: Dec. 11, 2001

(54) STATISTICAL ADJUSTMENT OF A/D NON-LINEARITIES TO CORRECT INTENSITY ARI

(75) Inventor: Daniel P. Timm, Colorado Spring, CO (US)

(73) Assignee: Agilent Technologies Inc., Palo Alto, CA (US)

( * ) Notice: Subject to any disclaimer, the term of this patent is extended or adjusted under 35 U.S.C. 154(b) by 0 days.

(21) Appl. No.: 09/183,301

(22) Filed: Oct. 30, 1998

(51) Int. Cl.$^7$ .................................................. H03M 1/06
(52) U.S. Cl. ............................ 341/118; 341/115; 341/120
(58) Field of Search ................................ 341/118, 119, 341/120, 121, 156, 107, 122, 142, 115, 106; 455/126; 345/467; 709/456

(56) References Cited

U.S. PATENT DOCUMENTS

| | | | |
|---|---|---|---|
| 4,628,298 | * 12/1986 | Hafle et al. ........................... | 341/106 |
| 5,396,493 | * 3/1995 | Sugiyama .............................. | 709/456 |
| 6,130,667 | * 10/2000 | Hasegawa et al. .................... | 345/467 |

* cited by examiner

*Primary Examiner*—Peguy JeanPierre
*Assistant Examiner*—Jean Bruner JeanGlaude
(74) *Attorney, Agent, or Firm*—Edward L. Miller

(57) ABSTRACT

Spurious artifacts in intensity emulation caused by measurement non-linearities within a statistically created raster display are reduced or eliminated by first characterizing the non-linearities. Armed with this information the collection of code values in an aperture can be inspected to notice which code values are occurring. M-many out of every n-many instances of a fat code can be replaced by an adjacent code, with a frequency of replacement that is selected to counteract the fatness. In principle, the replacement mechanism could be sensitive to prior events and propagate or distribute corrections across a family of abnormal codes. The idea is to statistically adjust the collection of codes to be closer to what it would be if there were no non-linearities. Different non-linearities may benefit from different strategies for replacement. Certain safeguards may be desirable to prevent making the problem worse rather than better.

2 Claims, 4 Drawing Sheets

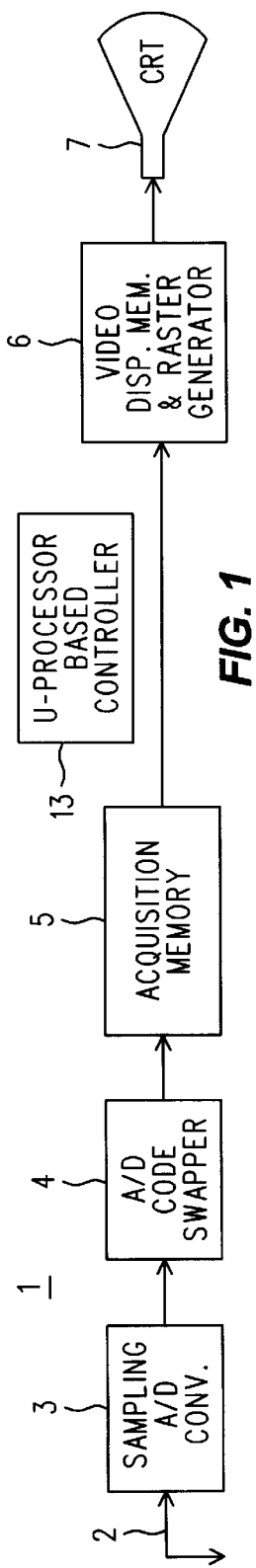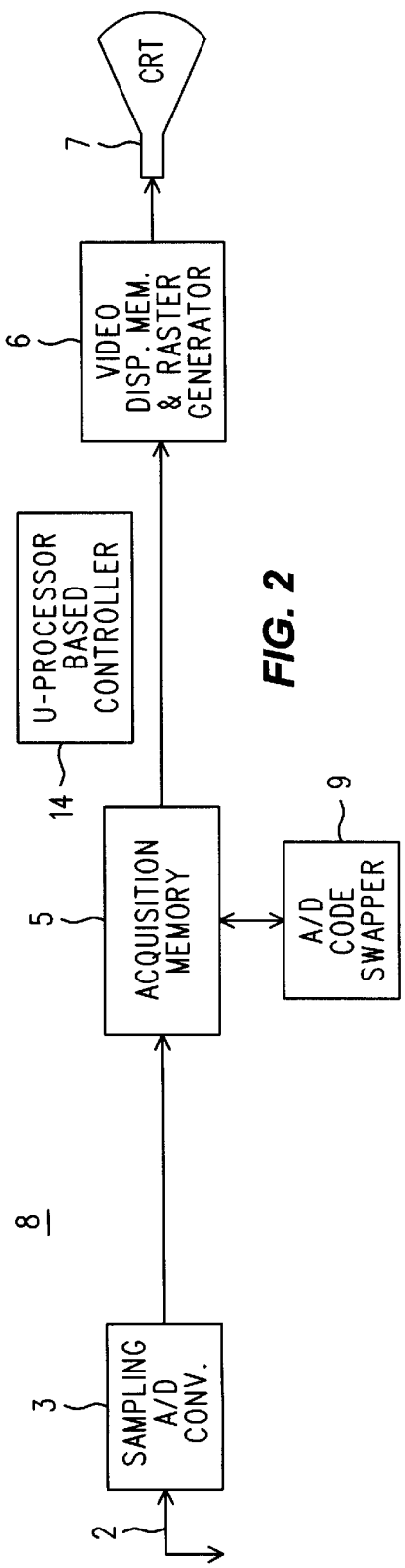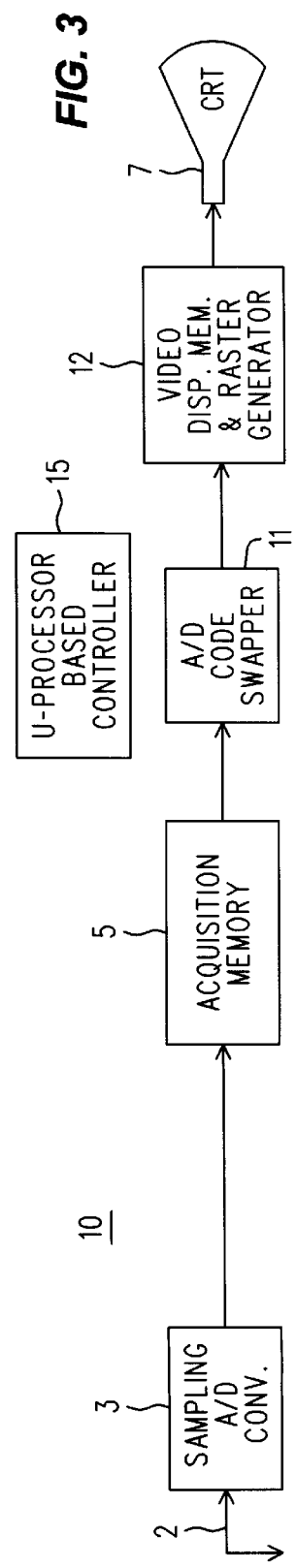

STATISTICAL ADJUSTMENT OF A/D NON-LINEARITIES TO CORRECT INTENSITY ARI

BACKGROUND OF THE INVENTION

Modem digital oscilloscopes have become an indispensable part of the arsenal of test equipment. Nevertheless, the standard of comparison for ease of use continues to be the venerable conventional analog oscilloscope, with its easily understood control scheme and its generally trustworthy and easily interpreted display. The purveyors of digital oscilloscopes continue to seek ways to make their products emulate the desirable aspects of conventional 'scopes while retaining the unique advantages available only with digital 'scopes.

The extent to which such emulation of any particular analog oscilloscope feature can be achieved depends a lot upon the internal architecture of the digital 'scope, of which there are several basic types. Consider, for example, the manner in which intensity variations in the trace of a conventional 'scope convey useful information in a repetitive trace. Fast edges appear dimmer than places where the trace transitions more leisurely. Waveform features that repeat regularly are brighter than ones that repeat irregularly or less frequently. For example, a pulse may have a bright trace that is of the generally correct shape and amplitude, but includes a superimposed faint and mis-shapen version. This informs the operator that every so often something unusual is occurring. True, it may be difficult or impossible to get the conventional 'scope to trigger on just the abnormal condition, but at least it has not lied to the operator; the suspicious trace is there to be viewed, however faintly. Even if one is compelled to move a bright base line off-screen, turn the intensity way up, and dim the room lights to see the anomaly better, the point is that the trusty analog 'scope is less a filter of information and more of a transparent window.

Most digital oscilloscopes, of whatever sampling architecture, have the potential for mimicking the analog 'scope's difference in trace intensity that results from the degree of regularity with which the pattern formed by the trace repeats itself at the same place on the screen. In particular, the digital oscilloscope architecture known as random repetitive sampling has an excellent such potential. In that type of 'scope a generally repetitive waveform is repeatedly regularly sampled, although not necessarily densely during any particular repetition. The various groups (repetitions) of samples are not allowed to remain at the same integral multiples of the sample time interval. Instead, each group's location on the time axis has some small and deliberately introduced random amount of offset relative to a trigger event. Thus, taken as a whole, the entire collection of samples is denser than the sample rate would otherwise imply. This is because the various groups may be "aligned", and in effect merged, by taking their individual group offsets also taken into account. Such "alignment" is essentially a matter of interpretation "after the fact", and need not involve shifting the contents of acquisition memory. Properly interpreted, the overall collection in the acquisition memory may be thought of as the result of merging the various groups, and corresponds in part to what the analog 'scope does when it writes on the CRT a series of generally similar or identical consecutive individual traces, one on top of the other, to form the bright trace so familiar to the user. To form a viewable display the random repetitive digital scope must take the 'scope's control settings (sweep speed, vertical sensitivity, etc.) into account, and put some subset of the data in the acquisition memory into a frame buffer whose addressable locations are in correspondence with the various pixel locations of a raster scanned display. What is actually stored in such an addressable frame buffer location can include an intensity value.

It is during this process that a digital 'scope can vary the intensity of the individual pixels written into the frame buffer, based upon various algorithmic criteria developed by the designers of the product. Suppose, for example, that the $n_{th}$ pixel position (call that, say, time 'x') along the X axis has three different Y locations that are to be illuminated. This means that during at least one group of samples the value $y_1$ was obtained at time x. During at least one other group of samples the value $y_2$ was obtained, as was $y_3$ during at least still a different group. Now suppose that there are twenty-five groups, and that $y^1$ occurred only twice, $y_2$ three times, and $y_3$ twenty times. These circumstances are consistent with a principal phase of the input waveform passing through $y_3$, while anomalous phases occasionally pass through $y_1$ and $y_2$. Clearly, the pixel locations for $y_1$ and $y_2$ should have less intensity than that for $y_3$. "Intensity emulation" is a term by which we may refer that type of manipulation. Clearly, there are other conditions in the sampled data that may also cause the trace intensity to be modified pursuant to the idea of intensity emulation.

An additional bit of background information will be useful in appreciating what is to follow. Let us look closer at the acquisition memory and its relationship to the frame buffer. The acquisition memory consists of a number of acquisition records. There may be a large number of such acquisition records, perhaps over one hundred. Each record is made up of a number of consecutively obtained samples. The number of samples in an acquisition record may be many times the number of pixel positions along the X axis of the display. This allows the user to stop the 'scope and then pan and zoom within a displayed waveform of interest, provided, of course, that there is enough captured data to create the desired view. For this and other reasons, it is usually the case that the granularity of the acquisition records (sampling time interval or limiting horizontal resolution) is not in direct one-to-one correspondence with the possible horizontal pixel positions of the display (the families of addressable Y locations of the frame buffer, each family corresponding to a given X location). Accordingly, and for each X position, there may be several consecutive samples within each acquisition record that contribute to the particular Y result(s) at that X position.

The same phenomenon occurs m the other major digital oscilloscope architecture: direct sequence sampling. In this type of 'scope a high speed sampling mechanism provides (in "real time") a dense single acquisition record, which can be quite long, perhaps several megabytes. This is the type of 'scope used when high "single shot" bandwidth is needed. It is still the case, however, that after the trigger event the captured data must be formatted to form a collection of illuminated pixels in a raster of, say, 256 lines by 512 or 1024 pixel positions along a line. Thus, once again, depending upon the settings of the controls, we have a plurality of consecutive samples contributing; to one or more Y values to be illuminated at a given X location in the displayed trace. It follows that intensity emulation is a possibility in direct sequence sampling digital oscilloscopes as well.

Intensity emulation is all well and good, but alas, other factors emerge to limit how well such intensity emulation works, and indeed, can even cause it to be misleading, which to some persons is worse than doing no intensity emulation at all. In other words, it can happen that the digital oscilloscope itself introduces spurious intensity changes into the trace, leaving the user to wonder just how useful the intensity emulation feature is, anyway, and just what else is there about this new and "better" oscilloscope that cannot be trusted?

As an example, a major source of spurious intensity emulation in oscillographic displays may be traced to the Analog to Digital (A/D) conversion process. The performance specifications of the Analog to Digital Converters (ADC's) used in low cost digital oscilloscopes can leave a lot to be desired, especially when it comes to linearity.

An ADC is an element that responds to an input voltage that can vary in arbitrarily small amounts by producing a corresponding discrete digital code. If there are 256 codes, and the input range is from zero to one volt, then there is an obvious correspondence that ought to obtain between inputs and outputs. The basis of this correspondence is that there are ordered 256 codes (a zero code and 255 non-zero codes), 255 transitions between the extremes, and that each time a monotonically increasing input value $V_{in}(0 \leq V_{in} \leq 1)$ advances by $1/256_{th}$ of a volt the output should increment by one code value, which could be expressed in a Gray code. Non-linearities occur when too much or not enough advance is required to produce an increment. In the first case we may say the code concerned is 'fat', and say that it is 'thin' in the other case. The degree to which a code is fat or thin may be indicated in units of nominal code width. A code with a width of '1' is neither fat nor thin. A code of width 1.2 is twenty percent wider than normal, and is fat, while one of width 0.7 is definitely thin.

So, consider a digital oscilloscope having an ADC with significant non-linearity. Now apply a precision triangle wave to the input, and adjust the controls such that several cycles are visible on the screen. Let there be several consecutive locations in each acquisition record corresponding to each column of pixel positions along the X axis. Many different Y values may be represented, and they will each be illuminated (as if along a vertical line in the displayed trace), although with an, intensity that is a function of their frequency of occurrence. Suppose that the actual analog signal value for an X pixel position often fell on a fat code. Then that fat code will be over represented in those locations within the data acquisition memory corresponding to that X pixel position, and we can expect that any thin codes will be under represented. That is, if a uniformly distributed signal is applied to a perfect ADC then a uniform distribution of digital codes would be expected to occur as a result. But non-linearity in the ADC will produce a corresponding skew in the resulting distribution. These disparities fool the intensity emulation mechanism and produce visible spurious intensity artifacts in the trace, especially when there occur consecutive groups or patterns of thin and/or fat codes, which can happen with certain systemic perversions within an ADC. Over represented fat codes can produce spurious bright locations in the trace, while under represented thin codes can produce spurious dim locations. It can be shown that even "nominal" amounts of ADC non-linearity can produce spurious intensity artifacts that will sometimes swamp out the legitimate intensity variations.

It will be appreciated that any digital oscilloscope architecture wherein either actual consecutive or construed as consecutive (through merging) samples are grouped together to arrive at Y values for a common displayed X pixel location, may fall prey to these or similar artifacts produced by non-linearity in the ADC. All that is required is an attempt to apportion an intensity property among a distribution of codes having unequal weights.

It would be desirable if such anomalous artifacts in intensity emulation could be reduced or eliminated while tolerating the non-linearities of low cost ADC's, and thus avoid incurring the extra cost of ADC's having either less non-linearity or, failing that, having higher precision. (Presumably the higher precision would allow the least significant bit or two to be thrown away, taking any non-linearity with it. How gross.) What to do?

SUMMARY OF THE INVENTION

A solution to the problem of reducing or eliminating spurious artifacts in intensity emulation caused by measurement non-linearities within a statistically created raster display is to first characterize the non-linearities. Armed with this information the collection of code values in an aperture can be inspected. The inspection mechanism notices which code values are occurring. In a simple implementation, one out of every so many instances of a fat code can be replaced by an adjacent code that is either less fat or actually thin, with a frequency of replacement that is selected to counteract the fatness. In a more general case, m-many out of every n-many instances can be replaced. In principle, the replacement mechanism could be sensitive to prior events and propagate or distribute corrections across a family of abnormal codes. Cost and complexity issues may limit the inspection to detecting the occurrence of only certain predetermined worst case codes that are a subset of the entire range, and may limit the generality of the replacement mechanism to more limited functionality, such as incrementing or decrementing a code. The idea is to statistically adjust the collection of codes to be closer to what it would be if there were no non-linearities. Different non-linearities may benefit from different strategies for replacement. Certain safeguards may be desirable to prevent making the problem worse rather than better.

BRIEF DESCRIPTION OF THE DRAWINGS

FIG. 1 is a simplified hardware block diagram of a first implementation for replacing A/D digital codes to compensate for non-linearity in a digital oscilloscope;

FIG. 2 is a simplified hardware block diagram of a second implementation for replacing A/D digital codes to compensate for non-linearity in a digital oscilloscope;

FIG. 3 is a simplified hardware block diagram of a third implementation for replacing A/D digital codes to compensate for non-linearity in a digital oscilloscope;

DESCRIPTION OF A PREFERRED EMBODIMENT

Figure 4:
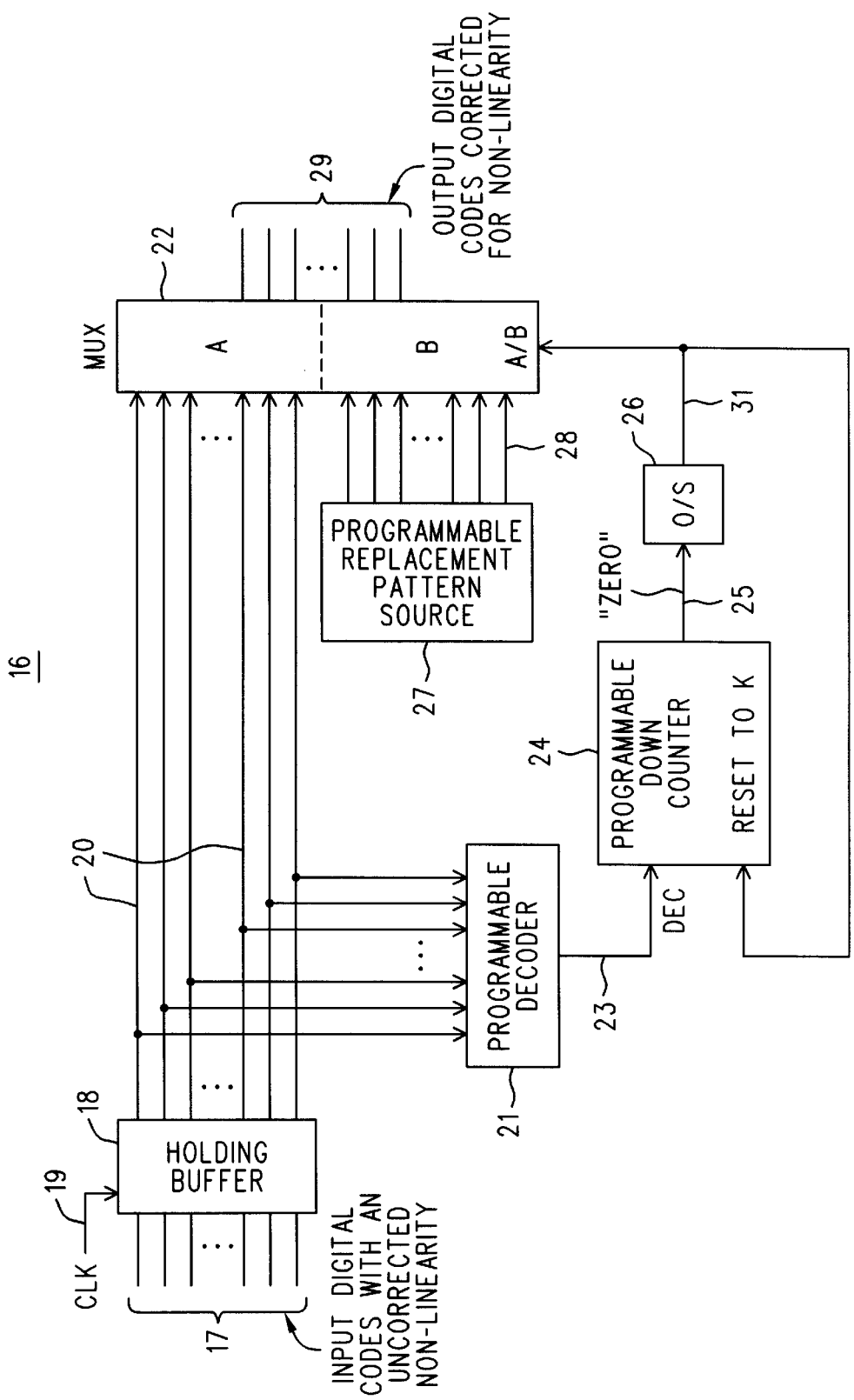
FIG. 4 is a simplified block diagram of a circuit that replaces a single selected A/D digital code with a programmed replacement digital code.

Refer now to FIGS. 1, 2 and 3, wherein are shown three simplified representations (1, 8, 10) of preferred ways of compensating non linearity in a sampling A/D converter 3 in the environment of a digital oscilloscope so as to reduce spurious outcomes during intensity emulation. In these figures like elements of the block diagram are given the same reference numerals, while those elements that are decidedly or potentially different have differing numerals. These block diagrams are sufficiently general in nature to not distinguish between the particular digital oscilloscope architectures of random repetitive sampling and direct sequence sampling, as that difference plays little or no direct role in the applicable principles of the invention, and it will be understood that block diagrams 1, 8 and 10 are intended to refer to digital oscilloscopes in general. That said, it will also be appreciated that it is possible that particular variations in the specific details; of a particular 'scopes construction may motivate corresponding variations in the implementation details of the invention.

Each of FIGS. 1, 2 and 3 share the following characteristics. A probe or other connection 2 couples a sampling A/D converter 3 to a signal to be measured in a work circuit (not shown). The A/D converter 3 produces a sequence of digital codes representing a time variant property of the signal being measured. The sequence of digital codes is stored in an acquisition memory 5, from whence it is processed and a portion of interest sent to a video display memory and raster generator (6, 12) that causes the information content therein to be presented as a visible trace upon a CRT 7. Although the figures show a CRT as the visual output device, it will be understood that such is merely exemplary, and that any of a variety of other visual output mechanisms could be used. These can include, but are not limited to, liquid crystal displays and ink jet printers. The architectural differences between random repetitive sampling 'scopes and their direct sequence counterparts is to be found largely in: (1) The sampling rate; and (2) How the acquisition memory is organized and employed. Those differences are well understood, and have already been briefly discussed in the Background.

Also shown in the figures are respective micro-processor based controllers 13, 14 and 15. We use the term "microprocessor" and "processor" in broad general terms, and it will be readily and naturally appreciated by those skilled in the art of digital oscilloscopes that the algorithms and procedures encoded in and executed by such processing mechanisms both: (1) Coordinate the operation of the various elements of the block diagrams in response to manipulation of the front panel or other controls (not shown); and (2) Account for the various user oriented operational features exhibited by the 'scope (such as intensity emulation). It will be further appreciated that such micro-processor based controllers may contain a mixture of actual discrete processors, embedded conventional instruction fetching and processing processors and state machines. While not exactly commodity items, modem digital oscilloscopes, and especially those of the medium to low cost variety, are certainly mass produced (at least in the sense that they are not individually hand made), and cost is a significant consideration. It will further be appreciated that the extent to which architectural features and their associated compensatory mechanisms (such as the one we are interested in) can be integrated into a VLSI solution is a powerful design criterion arising from marketing concerns. That is to say, it will be recognized that there are alternatives in these block diagrams that, while practical and feasible in a purely technical sense are nevertheless of, at present, varying degrees of attractiveness, owing to relative cost needed to obtain a certain level of performance (perceptions of which change over time and in response to unforeseen developments).

Now note that in each of the figures is a respective A/D code swapper 4, 9 and 11. Their overall function and purpose is the same: to compensate certain non-linearities in the digital codes provided by the sampling A/D converter 3. But since they are located in different locations in the block diagram they deal with information that is presented in different forms, and have corresponding internal operational differences. We shall now treat each in turn.

In FIG. 1 A/D code swapper 4 is located in the path between the sampling A/D converter 3 and the acquisition memory 5. Its task is to recognize selected digital codes and replace them with other codes, in accordance with a predetermined ratio (one out of n, or perhaps m out of n), so that the resulting stream of digital codes reaching the acquisition memory 5 is more nearly what it would have been if the sampling A/D converter 3 had no significant non-linearities. Clearly, to be located at this location in the block diagram 1 the A/D code swapper 4 has to operate at the same rate as the sampling A/D converter 3. For random repetitive 'scopes (and their relatively slow sample rates) this is quite feasible, and has the added advantage that the digital codes subsequently occupying the acquisition memory 5 appear to have come from a source having enhanced linearity, and can be processed as usual. That is, the A/D code swapper 4 can simply be added in with little or no changes to any of the rest of the system; its presence is transparent, so to speak. That can be a significant concern, since a lot of the 'scope's operational features are driven by what is stored in the acquisition memory 5.

In FIG. 2 the A/D code swapper 9 is coupled to the contents of the acquisition memory 5. In this arrangement the code swapper periodically inspects all or part of the content of the acquisition memory 5 and replaces certain digital codes with other codes. This inspection and replacement process would preferably be accomplished prior to using the data stored in the acquisition memory 5, so as to minimize any changes needed for an existing control system. Thus, the system of FIG. 2 may need some minor alteration to an existing control scheme. The arrangement of FIG. 2 may be most suited for use in a direct sequence sampling digital oscilloscope, as they can have very high sampling rates. In the arrangement of FIG. 2 the ability of the sampling A/D 3 (which might be many samplers running in parallel) to get digitized data into the acquisition memory 5 (which might be an arrangement of parallel segments corresponding to plural samplers) is unhampered. The only penalty is a slight delay after sampling and perhaps only after it has been decided that a trace is to be displayed. On the other hand, each sampler in a parallel collection might have its own code swapper, after the fashion of FIG. 1. One would have to look to the statistical properties to determine if one choice performs better than the other in any specific implementation.

In FIG. 3 the A/D code swapper 11 is located in the path between the acquisition memory 5 and the video display memory and raster generator 12. This placement of the code swapper 11 minimizes the number of digital codes that need to be inspected to just those pertaining to the trace to be displayed. If one were adding the A/D code swapper 11 to an existing product of this architecture, it also has perhaps the greatest risk of producing results that are inconsistent with other features or measurements driven by the (uncompensated) data stored in the acquisition memory. This may motivate changes in the control algorithms implemented by the micro-processor based controller 15 and uses to which data stored in the video display memory 12 are put. That is, features that used to be driven by data stored in the acquisition memory 5 might now be driven by data stored in the video display memory 15. However, these concerns would likely vanish if the implementation were "from the ground up", so to speak, rather than a retrofit job.

We now turn our attention to what goes on inside an instance of an A/D code swapper (4, 9 or 11). First, it will be recalled that the sampling A/D converter 3 will have been characterized ahead of time, so that its particular non-linearities will be known in specific detail. This, in principle, is not difficult, and amounts to applying a collection of accurately known values and comparing the resulting digital codes to a table of correct codes. Another way is to simply apply a time variant waveform, such as a triangle or sawtooth, to both the A/D to be characterized and a precision reference AID, and take note of the differences. Anyway, we will assume that some such characterization process has been performed, and that the results are available to us in some convenient form.

If the A/D of interest has non-linearities, then it will appear to have thin and fat codes. Naturally, for such information to be of any use to us it must include some indicator of relative degree of non-linearity. For convenience, we shall assume that this information has been, or could be, expressed in terms of a ratio of particular code with to the normal expected code with, as explained earlier. That is, we shall be prepared to say "This $n_{th}$ code is fat. It has a width of 1.2." Now, if it should happen that an adjacent code n+1 is thin at 0.8, and that codes n−1 and n+2 are both normal, we immediately suspect that one out of every six instances of code n could be replaced with an instance of code n+1. In contemplating the different ways that A/D non-linearity can manifest itself, we realize that there are many possible compensation schemes, and that economic practicalities soon come into play. We shall now discuss some of the more interesting possibilities.

First, we need a way to recognize that a code of interest has occurred. Next, we need a way to keep track of how often it has occurred recently. Finally, we need a way to replace a code of interest with a selected code when specified conditions have been met. Let us see how this can be done.

Consider the easiest possible case. Suppose that there were one pair of adjacent digital codes n and n+1 from the sampling D/A converter 3 that is a worst case; arguably worse than any other pair. Say, n is fat by 20% and n+1 is correspondingly thin, with codes n−1, n−2, etc. and n+2, n+3, etc. all apparently normal. Then it would appear that the fatness of n has arisen at the sole expense of n+1. Then for n only and no other code, we replace every sixth instance of the digital code for n with that of n+1. Note that we "put the blame", as it were, on code n, and do not drive the process with occurrences of n+1. According to the hypothesis, a code of n+1 is legitimate; it is only codes having a value of n that are suspect. A programmable circuit 16 for doing this sort of replacement is shown in FIG. 4.

Referring now to FIG. 4, a digital code 17 from a sampling A/D converter is applied to a holding buffer 18 that is clocked by a clock signal 19 occurring in appropriate synchrony with the sampling process. The value 20 captured by the holding buffer 18 is applied as an A input to a MUX 22 and to a decoder 21. Decoder 21 is simply a programmable gating circuit that produces a true output 23 whenever the input value 20 matches the programmed pattern. A pattern match causes a down counter 24 to decrement. When its count reaches zero an output 25 triggers a one shot 26 whose output 31 is used to both reset the counter to a programmable value K (say, six if code n is 20% fat) and cause MUX 22 to select an input B, instead of A, as the input to appear at the output 29. Input B is supplied by a programmable replacement pattern source 27 that supplies a programmed pattern 28. Thus, every $k_{th}$ instance of code q is replaced by whatever code is programmed as replacement pattern 28, which for this example could be the code q+1.

Next, consider the case where a plurality of codes are to be replaced. This may be achieved by the circuit arrangement 32 shown in FIG. 5, which is generally similar to the arrangement 16 of FIG. 4. This is achieved by multiple instances of programmable decoders 21*a–c*, whose outputs are respectively coupled to programmable down counters 24*a–c* and to sources of programmable replacement patterns 27*a–c*. The down counter outputs are captured by respective one shots 26*a–c* that are OR'ed together by OR gate 33, whose output 34 selects the B side of MUX 22 to become the corrected digital output 29. In the absence of an output from OR gate 33 the MUX 22 selects the A side (signals 20, which are original signals 17 via buffer 18) as the output 29. This scheme assumes that the outputs of the programmable replacement pattern sources 27*a–c* can be simply wire-OR'ed together, and that only one of the programmable down counters 24*a–c* will reach zero at any given time. This last assumption is easily justified on the grounds that each of the programmable decoders 21*a–c* decodes a different code, so only one down counter is decremented at a time.

Figure 5:
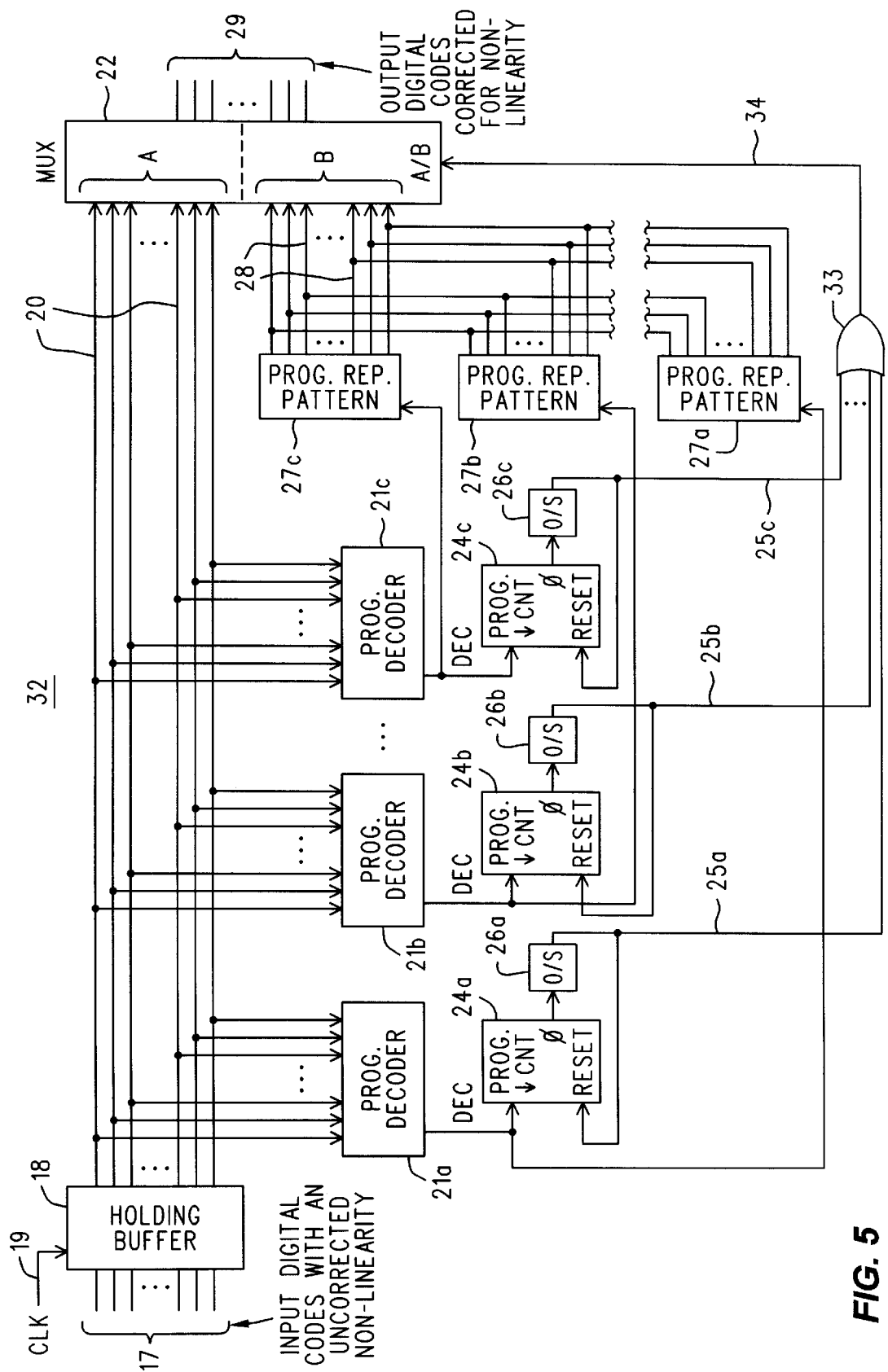
FIG. 5 is a simplified block diagram of a circuit that replaces a plurality of selected A/D digital codes with corresponding programmed replacement digital codes.

FIGS. 4 and 5 disclose exemplary hardware solutions to code replacement, which, because they can be seen as a serially inserted element having an input and an output separated by a uniform delay, are perhaps best suited for use in an environment such as FIG. 1. Equivalent replacement operations can also be accomplished in software, and since that is a medium well suited to reading from and writing to memory, a software implementation might be suited for an environment such as FIG. 2 or FIG. 3. It should be borne in mind that in principle, however, either hardware or software implementations could be accomplished for each of the block diagrams of FIGS. 1–3.

Furthermore, the hardware implementations of FIGS. 4 and 5 could be formed of discrete functional units (IC's) interconnected on a circuit board, or, preferably and more likely, as comparable or equivalent arrangements of computational and logic resources within a very large scale integrated circuit or application specific integrated circuit. These latter approaches could include programmed gate arrays and state machine architectures to control various useful functional resources.

Finally, it will be noted that the hardware implementations of FIGS. 4 and 5 are limited to replacing one out of every K-many instances of a code determined to be fat. A more general case is where m-many out of every n-many instances is to be replaced, producing a fractional ratio such as three out of eleven. While this sort of additional complexity can be realized with discrete functional elements of the sort shown in FIGS. 4 and 5, as shown in FIG. 6, it is perhaps best done with algorithmic state machines.

Figure 6:
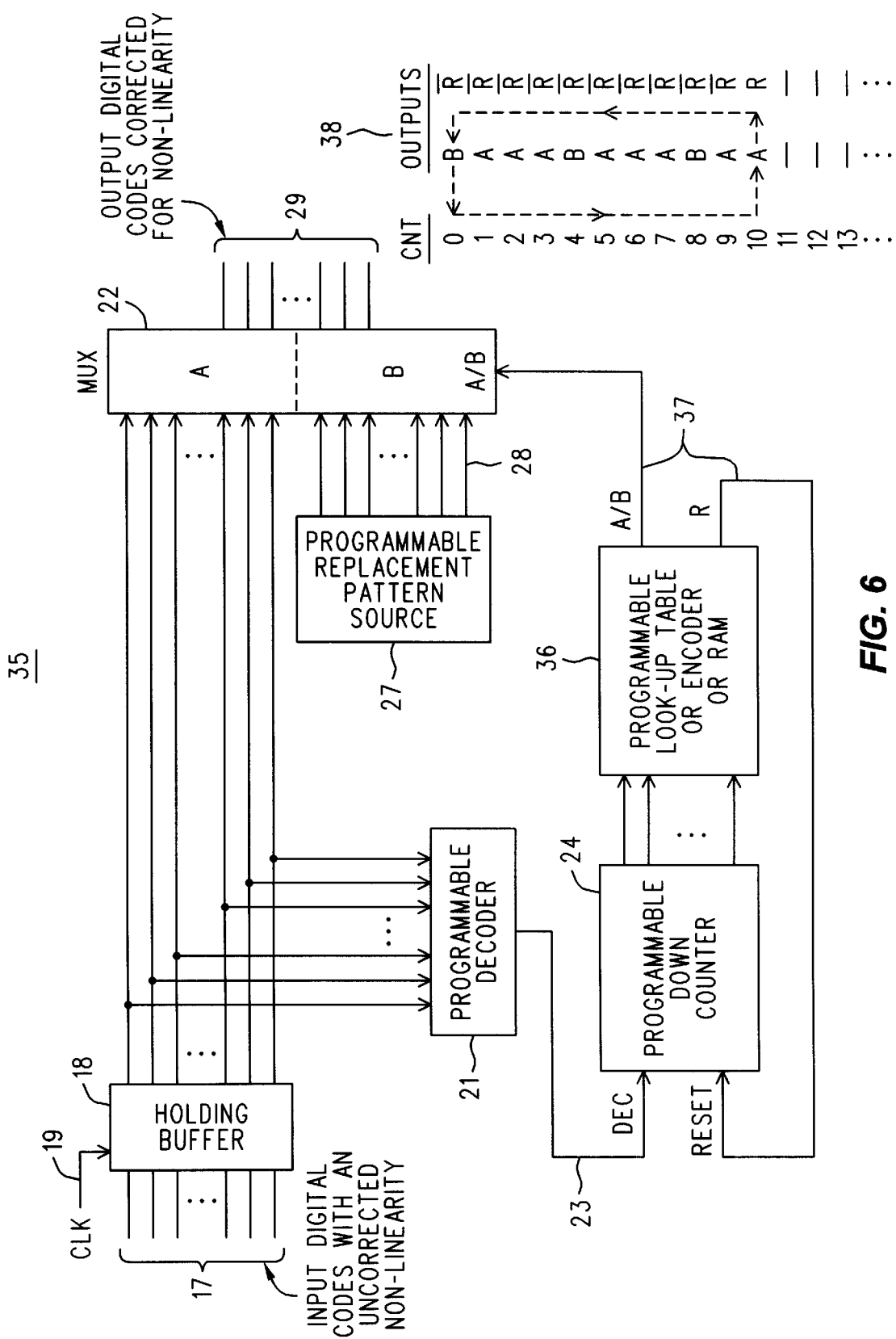
FIG. 6 is simplified block diagram of a circuit that replaces a programmable m-many of n-many instances of a particular A/D digital code with a programmed replacement digital code.

FIG. 6 is a simplified block diagram of a hardware implementation of a code swapper that replaces three out of eleven instances for a given code. In many respects it is similar to the arrangement 16 of FIG. 4. However, the entire encoded count output of the programmable down counter is applied to a programmable look-up table or encoded or RAM 36 that is responsive to any possible count in the down counter 24 by outputting a pair of signals 37, R and A/B. For an exemplary manner of dealing with three of eleven instances, these outputs R and A/B may be related to those possible counts (0 to 10) as shown in the tabular legend 38. Essentially, the look-up table 36 associates with each count which of the A or B inputs to the MUX are to be used as the output 29 (the A/B signal) and resets the programmable down counter at the end of its count cycle (R). Note that this architecture is flexible. The programmable down counter 24 can be capable of operation up to some large count (m), as can the look-up table 36. But by proper encoding in the table the RESET signal can be located as early in the count cycle as desired. Then the desired (and arbitrary) distribution of (n-many) B's and (the rest) A's are encoded for the counts that will remain as part of the cycle. The B's cause the code substitution to occur.

The same remarks pertaining to variations in hardware implementation that were made concerning FIGS. 4 and 5 pertain to FIG. 6, also.

There are other strategies for replacing digital codes from an ADC that exhibits non-linearity. So far, we have looked at the "absolute worst" case of a fat/thin pair, and generalized that to substitution for a limited plurality of such pairs. Clearly, if the resources are economically available, there seems to be no technical reason why all ADC digital codes can not be subject to replacement, contingent only on their actually being in need of it, as revealed by an initial linearity characterization. Another selection strategy for choosing which digital codes to remap is to find not necessarily the fattest codes, but the fat code/thin code adjacent combinations that have the greatest difference in width, even though it is not necessarily the case that the fat code is fat at the expense of that particular thin neighbor. With this strategy the fat one would be remapped into the thin one with a frequency that mimicked their both having a width that is the average of the two.

Now, even though it may be decided that a replacement frequency of one out of n or m out of n instances is warranted, it might still be desirable for that ratio to be only the average ratio, and for there to be a relatively random placement of the m-many substitutions within the n-many instances. Pseudo random sequence generators can be used to accomplish this in hardware, as can pseudo random number generators in software.

Lastly, the type of adjacent fat-thin non-linearity that we have been considering is generally termed "differential" non-linearity. There is another type called "integral" non-linearity where there are one or more bands of adjacent fat codes interspersed with one or more bands of adjacent thin codes. It will be apparent to those skilled in the art that the techniques described above allow compensation of integral non-linearity as well.

The principal requirement for compensating integral non-linearity is a sufficient number of A/D code swappers; one is needed for each code in a band that is to be compensated. Second, the results of characterizing the ADC's non-linearity must be interpreted with an eye toward fixing the integral non-linearity. As before, no code will be reassigned any further away than an adjacent neighbor. However, it is possible to treat the band as a whole such that parts get more or less frequent reassignment than other parts, so that the aggregate result over the whole band is more nearly statistically equivalent to what would have been produced for the same input using a perfect ADC. In contrast with fixing differential non-linearity, this may involve the reassignment of a thin code to one neighbor, with the expectation that it might still be "fattened" overall, owing to a greater amount of reassignment to that thin code from the other neighbor. All of the hardware and software techniques previously mentioned for A/D code swappers are applicable, and no new type of A/D code swapper is, in principle, needed, nor need there be any multi-pass operations.

I claim:

1. A method of compensating non-linearities in a collection of sampled digital values produced by an analog to digital converter having fat and thin digital codes, the method comprising the steps of:

characterizing the analog to digital converter to identify the degree to which each digital code is either fat, thin or neither;

digitizing an analog signal with the analog to digital converter to produce a collection of digital codes;

detecting in the collection of digital codes occurrences of a selected fat digital code;

replacing in the collection m-many out of n-many occurrences of the detected selected fat digital code with an adjacent digital code, m and n being integers related to the degree to which the selected fat digital code is fat; and generating an image corresponding to the input signal having intensity variations produced in accordance with digital codes in the collection thereof that have been replaced by the replacing step.

2. A method as in claim 1 wherein the adjacent digital code is thin.

* * * * *